(12) United States Patent
Rehmeyer et al.

(10) Patent No.: US 12,197,264 B2
(45) Date of Patent: Jan. 14, 2025

(54) POWER MANAGEMENT FOR A MEMORY DEVICE

(71) Applicant: Micron Technology, Inc., Boise, ID (US)

(72) Inventors: James S. Rehmeyer, Boise, ID (US); Gary L. Howe, Allen, TX (US); Miles S. Wiscombe, Boise, ID (US); Eric J. Stave, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 422 days.

(21) Appl. No.: 17/094,579

(22) Filed: Nov. 10, 2020

(65) Prior Publication Data

US 2022/0147131 A1    May 12, 2022

(51) Int. Cl.
*G06F 1/32* (2019.01)
*G06F 1/3203* (2019.01)
*G11C 11/40* (2006.01)
*G11C 11/4074* (2006.01)

(52) U.S. Cl.
CPC ........ *G06F 1/3203* (2013.01); *G11C 11/4074* (2013.01)

(58) Field of Classification Search
CPC ...... G06F 1/3203; G06F 1/324; G06F 1/3296; G11C 11/4074
See application file for complete search history.

(56) References Cited

U.S. PATENT DOCUMENTS

| | | | |
|---|---|---|---|
| 2003/0076125 A1* | 4/2003 | McCord | G11C 29/006 324/754.07 |
| 2008/0191789 A1* | 8/2008 | Anidjar | H03K 19/0027 327/544 |
| 2010/0026378 A1* | 2/2010 | Parker | G06F 1/26 716/100 |
| 2014/0244947 A1* | 8/2014 | Song | G06F 13/1694 711/154 |
| 2014/0301152 A1* | 10/2014 | Cox | G11C 11/409 365/222 |
| 2015/0149841 A1* | 5/2015 | Gerber | G06F 13/4068 710/22 |
| 2015/0227185 A1* | 8/2015 | Pal | G06F 1/3203 713/320 |
| 2017/0108917 A1* | 4/2017 | Lee | G06F 15/7807 |
| 2017/0315747 A1* | 11/2017 | Yang | G06F 3/0634 |

(Continued)

*Primary Examiner* — Jaweed A Abbaszadeh
*Assistant Examiner* — Cheri L Harrington
(74) *Attorney, Agent, or Firm* — Holland & Hart LLP

(57) ABSTRACT

Methods, systems, and devices for power management for a memory device are described. For example, a memory device may include one or more memory dies and may be configured to operate using a first supply voltage and a second supply voltage. The first supply voltage may be associated with a first defined voltage range, and the second supply voltage may be associated with a second defined voltage range. The memory device may include a power management integrated circuit (PMIC) that is coupled with the one or more memory dies and provides the supply voltages to the one or more memory dies. The PMIC may be configured to provide, to the one or more memory dies, a first voltage that is within the first defined voltage range as the first supply voltage and a second voltage that is outside the second defined voltage range as the second supply voltage.

19 Claims, 7 Drawing Sheets

(56) References Cited

U.S. PATENT DOCUMENTS

2018/0246662 A1* 8/2018 Kim .................. G06F 1/3275
2021/0055776 A1* 2/2021 Parry ................. G06F 1/3275
2021/0065772 A1* 3/2021 Suh .................... G06F 1/324

* cited by examiner

POWER MANAGEMENT FOR A MEMORY DEVICE

FIELD OF TECHNOLOGY

The following relates generally to one or more systems for memory and more specifically to power management for a memory device.

BACKGROUND

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
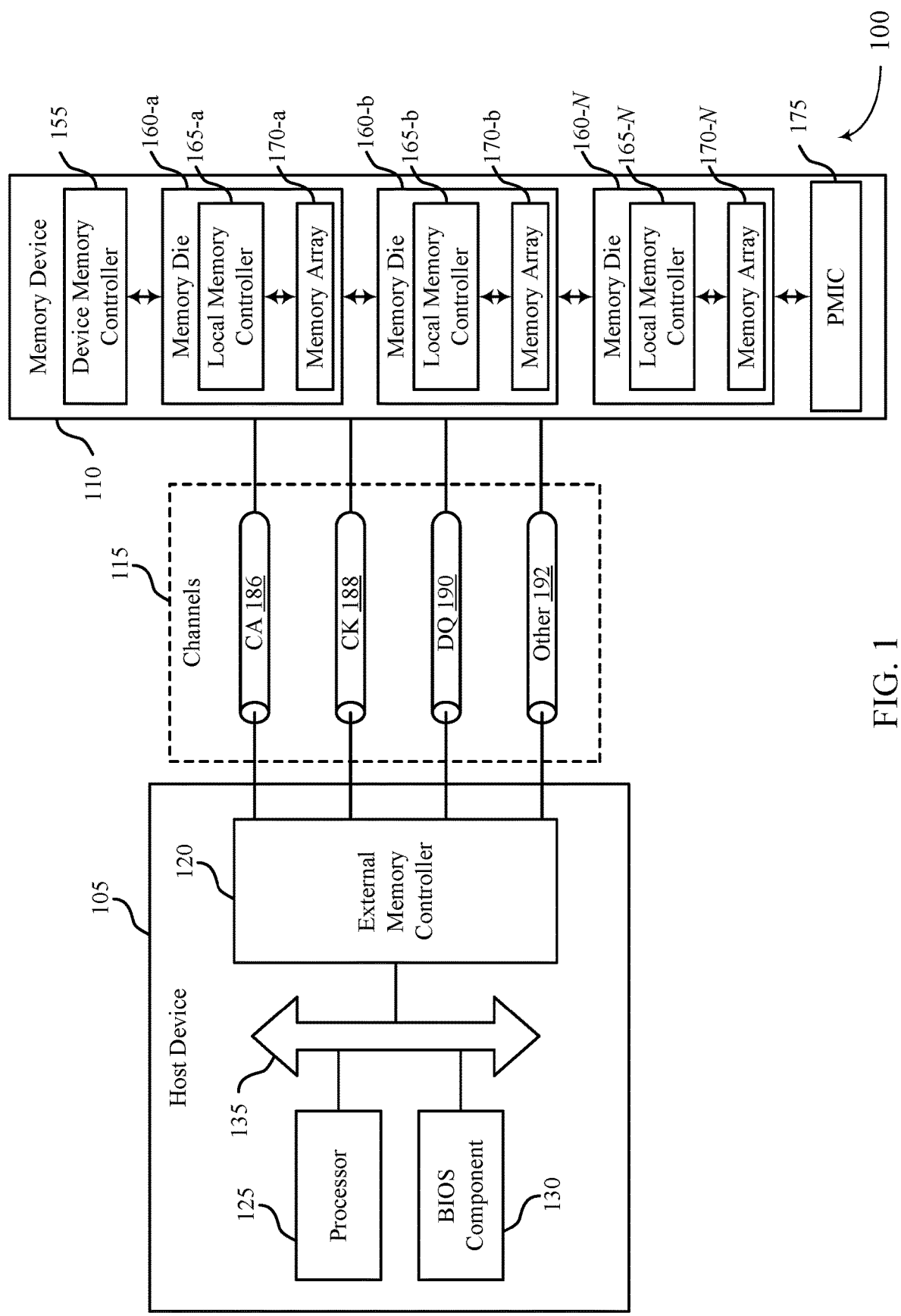
FIGS. 1-3 illustrate examples of systems that support power management for a memory device in accordance with examples as disclosed herein.

A memory device may receive one or more supply voltages that enable the memory device to provide voltages to various components of the memory device. In some cases, default values or ranges for the supply voltages (e.g., a range may correspond to a value plus or minus some tolerance) may be defined. For example, a default value or range for a supply voltage may be defined in a standard (e.g., a Joint Electron Device Engineering Council (JEDEC) standard, or some other standard) that is applicable to the memory device. Here, a memory device operating using a supply voltage that is within the defined voltage range may be expected to satisfy one or more performance thresholds (e.g., a speed threshold for performing an access operation, a reliability threshold, or some other threshold).

In some cases, however, supplying a memory device with a supply voltage that is outside of (e.g., below or above) the defined voltage range may improve one or more metrics of the memory device (e.g., a power consumption, a speed of the memory device, a reliability of the memory device). For example, a memory device may satisfy the one or more performance thresholds based on receiving a supply voltage that is below the defined voltage range. Here, supplying the memory device with a supply voltage that is below the defined voltage range may decrease a power consumption of the memory device without preventing the memory device from satisfying the one or more performance thresholds. In another example, supplying the memory device with a supply voltage that is above the defined voltage range may improve the performance of the memory device (e.g., increase a speed of the memory device, increase a reliability of the memory device) when compared to supplying the memory device with a supply voltage that is within the defined voltage range, or may improve a production yield associated with producing the memory device by allowing one or more components (e.g., memory dies) that would otherwise fail a performance threshold to instead satisfy the performance threshold. These benefits are exemplary, and other benefits of supplying a memory device with a supply voltage that is outside a default (e.g., standardized or otherwise defined) voltage range may be appreciated by one of ordinary skill in the art.

Techniques are described herein to supply a memory device with a supply voltage that is outside of a defined voltage range associated with the memory device or one or more components (e.g., memory dies) thereof. For example, a memory device may be coupled with a power management integrated circuit (PMIC) configured to provide one or more supply voltages to the memory device (e.g., to one or more memory dice on the memory device). The PMIC may provide a supply voltage (e.g., a drain power voltage (VDD), a programming power voltage (VPP)) to the memory device that is outside of a defined voltage range (e.g., as defined by a standard). For example, if a memory device satisfies a performance threshold when supplied with a voltage that is lower than the defined voltage range, the PMIC may provide the supply voltage that is lower than the defined voltage range thereby reducing power consumption (e.g., when compared to the PMIC providing the supply voltage that is within the defined voltage range) while maintaining performance of the memory device. Additionally or alternatively, the PMIC may provide a supply voltage that is above the defined voltage range to improve the performance of a memory device (e.g., increase the speed of operations of the memory device, improve a reliability of the memory device).

Features of the disclosure are initially described in the context of systems and devices as described with reference to FIGS. 1-3. Features of the disclosure are described in the context of a process flow as described with reference to FIG. 4. These and other features of the disclosure are further illustrated by and described with reference to an apparatus diagram and flowcharts that relate to power management for a memory device as described with reference to FIGS. 5-7.

FIG. 1 illustrates an example of a system 100 that supports power management for a memory device in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Additionally, the memory device 110 may include a PMIC 175 that is coupled with the one or more of the memory dies 160. In some examples, the memory device 110 may be a dual in-line memory module (DIMM). In some examples, the one or more memory dies 160 may each include dynamic random access memory (DRAM) memory cells. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device 110. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

The PMIC 175 may provide various supply voltages to the components of the memory device 110 (e.g., to the one or more memory dies 160, the device memory controller 155, or another component of the memory device 110), and a memory die 160 may be configured to operate using the provided supply voltages. In some cases, the supply voltages may be defined by or otherwise in accordance with a standard (e.g., a JEDEC standard). For example, the standard may define a voltage range for a supply voltage. Here, a memory die 160 operating using a supply voltage that is within the defined voltage range may be expected to satisfy one or more performance thresholds (e.g., a speed threshold for performing an access operation, a reliability threshold). For example, the standard may indicate that a memory die 160 receiving a supply voltage within the defined voltage range is expected to operate at or above a certain speed. In another example, the standard may indicate that a memory die 160 receiving a supply voltage within the defined voltage range is expected to meet a reliability threshold.

A memory die 160 may satisfy the one or more performance thresholds when supplied with a voltage that is outside of the defined voltage range (e.g., as defined by a standard). Here, the PMIC 175 may be configured to provide the memory die 160 with a supply voltage that is outside of the defined voltage range. For example, the PMIC 175 may provide a voltage to the memory die 160 that is lower than the defined voltage range, thereby conserving power. In some other examples, the PMIC 175 may provide a voltage to the memory die 160 that is above the defined voltage range, thereby increasing performance of the memory die 160. In either example, the memory device 110 may be assembled to include memory dies 160 having similar performance characteristics and the PMIC 175 may be configured to provide supply voltages based on the performance characteristics of the memory dies 160. For example, the memory device 110 may be assembled to include memory dies 160 that each satisfy one or more performance thresholds when receiving a supply voltage that is lower than the defined voltage range. Here, the PMIC 175 may additionally be configured to provide the supply voltage that is lower than the defined voltage range to each of the memory dies 160. In another example, the memory device 110 may be assembled to include memory dies 160 that each have improved performance metrics when receiving a supply voltage that is higher than the defined voltage range. Here, the PMIC 175 may additionally be configured to provide the supply voltage that is higher than the defined voltage range to each of the memory dies 160.

Figure 2:
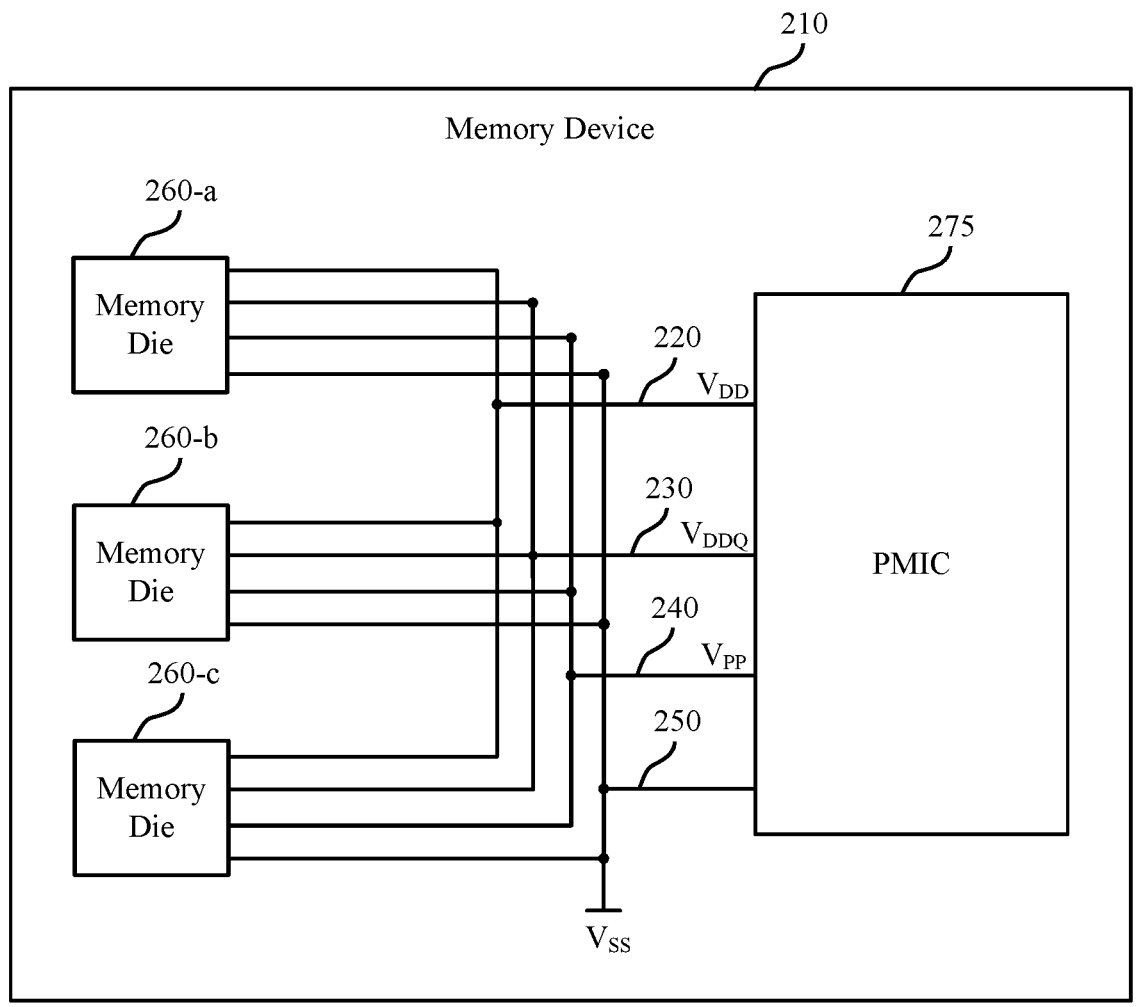

FIG. 2 illustrates an example of a system 200 that supports power management for a memory device in accordance with examples as disclosed herein. The system 200 may implement aspects of the system 100, as described with reference to FIG. 1. For example, the system 200 may include a memory device 210, which may be an example of a memory device 110 described with reference to FIG. 1. The memory device 210 may include one or more memory dies 260 and a PMIC 275. For example, the memory device 210 may include memory die 260-a, memory die 260-b, memory die 260-c and PMIC 275, which may be examples of a memory die 160 and a PMIC 175, as respectively described with reference to FIG. 1.

In some cases, the memory device 210 may be an example of a DIMM or a small outline DIMM (SO-DIMM). Here, the memory device 210 may be packaged into components or modules such that the memory device 210 may be integrated into a larger device (e.g., using one or more ports or connectors). The memory device 210 may include a set of memory dies 260, each of which may be configured to operate using one or more supply voltages. For example, the memory dies 260 may be configured to receive a first supply voltage (e.g., VDD 220), a second supply voltage (e.g., output stage drain power voltage (VDDQ) 230), a third supply voltage (e.g., VPP 240), and a fourth supply voltage (e.g., a ground supply voltage (VSS) 250). In some cases, one or more of the values of the supply voltages VDD 220, VDDQ 230, VPP 240, and VSS 250 may be specified (e.g., defined) by a standard (e.g., a JEDEC standard). In some cases, the supply voltages may be specified by a defined voltage range. For example, the standard may indicate a nominal voltage value of a supply voltage (e.g., 1.1V for VDD 220 and VDDQ 230, 1.8V for VPP 240, system ground for VSS 250) and a tolerance for that supply voltage (e.g., a percentage amount greater than or less than the nominal voltage value). Thus, each of the supply voltages VDD 220, VDDQ 230, VPP 240, and VSS 250 may be associated with a defined voltage range.

The memory device 210 may include a PMIC 275 that is configured to supply the voltages VDD 220, VDDQ 230, and VPP 240 to each of the memory dies 260 of the memory device 210. That is, the PMIC 275 may be configured to manage power constraints of the various components of the memory device 210 including the memory die 260-*a*, memory die 260-*b*, and memory die 260-*c*. Here, the PMIC 275 may perform current conversion, power-source selection, voltage scaling, power sequencing, or deactivated state power control, or any combination thereof, to provide appropriate voltages to the various components of the memory device 210 (e.g., the memory dies 260). In some cases, the memory devices 260 and the PMIC 275 may each share (e.g., be coupled with) a common VSS 250. In some cases, VSS 250 may be supplied by the PMIC 275 along with VDD 220, VDDQ 230, and VPP 240, or alternatively VSS 250 may be supplied by some other component (not shown) of the memory device 210 or may be a common ground reference.

The voltage levels of each of the supply voltages (e.g., VDD 220, VDDQ 230, and VPP 240) output by the PMIC 275 may be configured prior to an operation of the system 200 (e.g., during an initialization of the system 200 that occurs prior to the system 200 being in communication with a host device as described with reference to FIG. 1). In one example, the voltage levels of each of the supply voltages output by the PMIC 275 may be configured prior to assembling the memory device 210 (e.g., prior to coupling the memory dies 260 with the memory device 210). In another example, the voltage levels of each of the supply voltages output by the PMIC 275 may be configured after assembling the memory device 210 (e.g., after each of the memory dies 260 is coupled with the memory device 210 and the PMIC 275).

The PMIC 275 may identify (e.g., during the initialization of the system 200) which voltages to supply to the memory dies 260 as the VDD 220, the VDDQ 230, and the VPP 240. Then, during subsequent operation of the system 200, the PMIC 275 may supply the identified voltages to the memory dies 260 as the VDD 220, VDDQ 230, and the VPP 240. In some cases, the PMIC 275 may identify the voltage levels of the VDD 220, the VDDQ 230, and the VPP 240 based on one or more values stored by a register (e.g., that is coupled with or included in the PMIC 275). Here, the PMIC 275 may read the values stored in the register (e.g., during the initialization of the system 200) and identify the voltage levels of the VDD 220, the VDDQ 230, and the VPP 240 based on the values stored in the register. In some examples, configuring the voltage levels of each of the supply voltages (e.g., VDD 220, VDDQ 230, and VPP 240) output by the PMIC 275 may include programming (e.g., writing) values onto the register.

The values of the supply voltages provided by the PMIC 275 may be fixed (e.g., locked, static) after the voltage levels of each of the supply voltages (e.g., VDD 220, VDDQ 230, and VPP 240) output by the PMIC 275 are configured. That is, after assembly of the system 200, while the system 200 is operating, or both, the supply voltages provided by the PMIC 275 maybe unalterable. In some cases, the memory device 210 may be in communication with a host device (e.g., as described with reference to FIG. 1) as part of the system 200, and the host device may be unable to alter the voltage levels of the VDD 220, VDDQ 230, and VPP 240 (e.g., while the system 200 is operating or otherwise). Thus, the values of the VDD 220, VDDQ 230, and the VPP 240 may be fixed (e.g., locked). In an example where the voltage levels of the VDD 220, VDDQ 230, and VPP 240 are configured based on one or more values in a register, the register may be a one-time programmable register (e.g., a fuse, a fuse array). Thus, the host device may not be able to program the register to a different value after the register is initially programmed.

In some cases, the PMIC 275 may be configured to provide one or more supply voltages that are each within a defined voltage range associated with each of the supply voltages. In some other cases, the PMIC 275 may be configured to provide one or more supply voltages that are outside of a defined voltage range associated with the supply voltage. That is, the PMIC 275 may provide at least one supply voltage (e.g., VDD 220, VDDQ 230, VPP 240) to the memory dies 260 that is outside the defined voltage range. For example, the PMIC 275 may be configured to provide one or more supply voltages (e.g., a VDD 220, VPP 240, or both) to the memory dies 260 at voltage levels that are lower than the defined voltage ranges. That is, the memory dies 260 may satisfy a performance threshold when supplied with a supply voltage (e.g., a VDD 220, VPP 240, or both) that is lower than the defined voltage range. Here the PMIC 275 may provide the lower supply voltages to conserve power.

Additionally or alternatively, the PMIC 275 may be configured to provide one or more supply voltages (e.g., a VDD 220, VPP 240, or both) to the memory dies 260 at voltage levels that are greater than the defined voltage ranges. That is, a performance metric of the memory dies 260 may be improved by supplying the memory dies 260 with one or more supply voltages that are greater than the defined voltage ranges. In some cases, the memory dies 260 may fail to satisfy the performance threshold when supplied with supply voltages within the defined voltage ranges. Here, the PMIC 275 may be configured to provide the supply voltages that are greater than the defined voltage ranges to ensure that the memory dies 260 satisfy the performance threshold. In some other cases, the memory dies 260 may satisfy the performance threshold when supplied with the supply voltages within the defined voltage ranges and the PMIC 275 may be configured to provide one or more supply voltages that are greater than the defined voltage ranges to further improve a performance of the memory dies 260 (e.g., to increase a speed of the memory dies 260, to improve a reliability of the memory dies 260).

Figure 3:
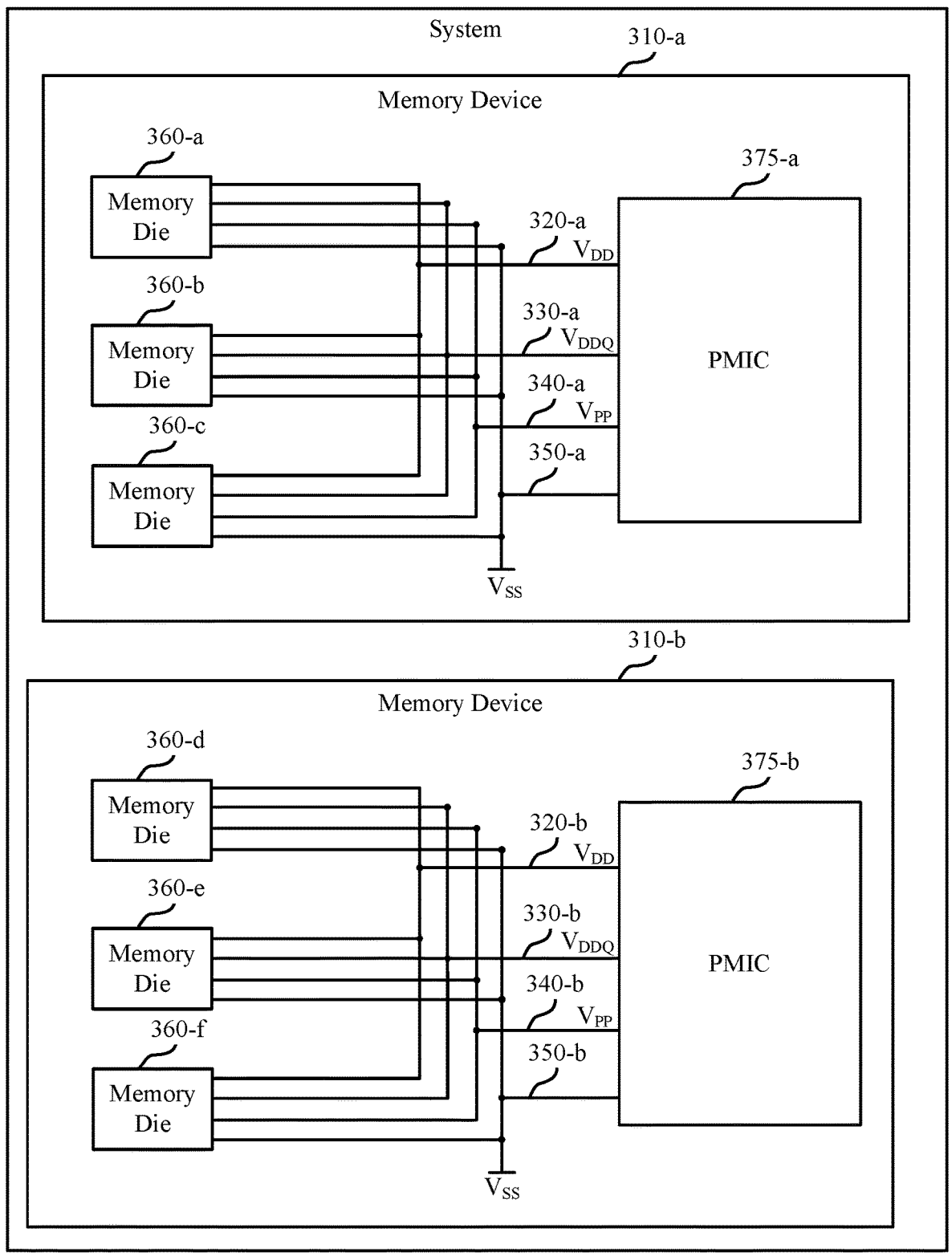

FIG. 3 illustrates an example of a system 300 that supports power management for a memory device in accordance with examples as disclosed herein. The system 300 may implement aspects of the systems 100 and 200 as described with reference to FIGS. 1 and 2, respectively. For example, the system 300 may include memory device 310-*a* and memory device 310-*b*, which may be examples of a memory device as described with reference to FIGS. 1 and 2. The memory device 310-*a* and the memory device 310-*b* may include one or more memory dies 360 and a PMIC 375, which may be examples of the memory dies and PMICs as described with reference to FIGS. 1 and 2. The memory device 310-*a* may include memory dies 360-*a*, 360-*b*, and 360-*c* and the PMIC 375-*a*, and the memory device 310-*b* may include memory dies 360-*d*, 360-*e*, and 360-*f* and the PMIC 375-*b*.

The system 300 may include more than one memory device 310, where each memory device 310 includes a separate PMIC 375 and distinct memory dies 360. In some cases, the memory devices 310 may be individually configured. In some cases, the system 300 may include memory devices 310 having different configurations. Additionally or alternatively, the system 300 may include memory devices 310 having a same configuration. In some instances, the memory devices 310 may be grouped into a same corresponding memory device 310 based on performance characteristics of the memory dies 360 of that memory device 310. For example, each of the memory dies 360 of a memory device 310 may have similar performance characteristics. That is, the memory device 310-*a* may be configured based on each of the memory dies 360-*a*, 360-*b*, and 360-*c* having similar performance characteristics as each other, and the memory device 310-*b* may be configured based on each of the memory dies 360-*d*, 360-*e*, and 360-*f* having similar performance characteristics as each other. In another example, however, a memory device 310 may include memory dies 360 having different performance characteristics.

The performance characteristics of the memory dies 360 may relate to whether the memory dies 360 satisfy a performance threshold when provided with supply voltages having different voltage levels. That is, two memory dies 360 may have similar performance characteristics if both memory dies 360 satisfy a performance threshold when provided with a supply voltage (e.g., VDD 320, VDDQ 330, VPP 340, VSS 350) that is less than a defined voltage range for that supply voltage.

In one case, the memory dies 360-*a*, 360-*b*, and 360-*c* may have similar performance characteristics to one another, and the memory dies 360-*d*, 360-*e*, and 360-*f* may have similar performance characteristics to one another, but the memory dies 360 of memory device 310-*a* may or may not have similar performance characteristics as the memory dies 360 of memory device 310-*b*. For example, the memory die 360-*a*, the memory die 360-*b*, and the memory die 360-*c* of memory device 310-*a* may satisfy a performance threshold when supplied with a supply voltage (e.g., VDD 320-*a*, VPP 340-*a*, or both), that is lower than a defined voltage range associated with the supply voltage. Accordingly, the PMIC 375-*a* may be configured to provide the supply voltage to the memory die 360-*a*, the memory die 360-*b*, and the memory die 360-*c* that is lower than the defined voltage range. Additionally or alternatively, the PMIC 375-*a* may be configured to provide one or more supply voltages (e.g., one or more of VDD 320-*a*, VDDQ 330-*a*, VPP 340-*a*, and VSS 350-*a*) to the memory dies 360-*a*, 360-*b*, and 360-*c* that are within a defined voltage range associated with the one or more supply voltages.

In another example, one or more of the memory dies 360-*d*, 360-*e*, and 360-*f* of memory device 310-*b* may fail to satisfy the performance threshold when supplied with one or more supply voltages (e.g., VDD 320-*b*, or VPP 340-*b*, or both) that are lower than the defined voltage ranges. Here, the PMIC 375-*a* may be configured to provide the one or more supply voltages to the memory dies 360-*d*, 360-*e*, and 360-*f* that are within the respectively defined voltage ranges. In some other cases, one or more of the memory dies 360-*d*, 360-*e*, and 360-*f* may fail to satisfy a performance threshold when supplied with the one or more supply voltages that are within the defined voltage ranges. Here, the PMIC 375-*a* may be configured to provide the one or more supply voltages to the memory dies 360-*d*, 360-*e*, and 360-*f* that are greater than the defined voltage ranges. In still some other cases, one or more of the memory dies 360-*d*, 360-*e*, and 360-*f* may satisfy the performance threshold when supplied with the one or more supply voltages within the defined voltage ranges, and the PMIC 275 may be configured to provide the one or more supply voltages that are greater than the defined voltage ranges to further improve the performance of the memory dies 360-*d*, 360-*e*, and 360-*f*.

Thus, the memory devices 310 (and corresponding PMICs 375) may be configured based on the performance characteristics of the memory dies 360 associated with each memory device 310.

Figure 4:
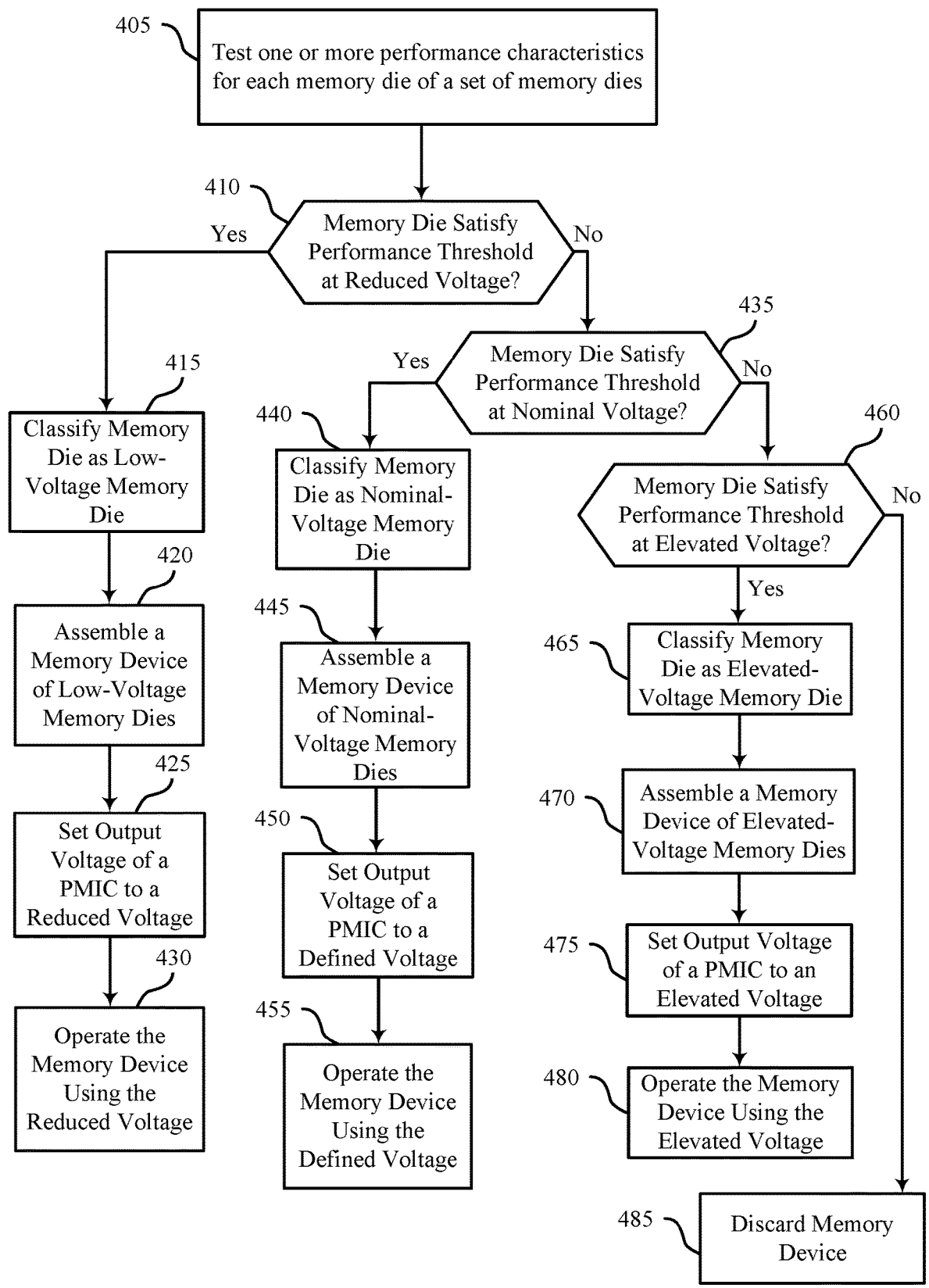
FIG. 4 illustrates an example of a process flow that supports power management for a memory device in accordance with examples as disclosed herein.

FIG. 4 illustrates an example of a process flow 400 that supports power management for a memory device in accordance with examples as disclosed herein. Aspects of the process flow 400 may implemented by test equipment, fabrication equipment, or any combination thereof. For example, aspects of the process flow 400 may be implemented to test and assemble a memory device, which may be an example of a memory device as described with reference to FIGS. 1 through 3. The process flow 400 may be implemented to conserve power and improve performance of a memory device during operation of the memory device. In the following description of the process flow 400, the operations may be performed in different orders or at different times. Some operations may also be omitted from the process flow 400, and other operations may be added to the process flow 400.

At 405, one or more performance characteristics of each memory die of a set of memory dies may be tested. For example, one or more timings of a memory die may be tested, such as, for example, an array access time ($T_{AA}$), a row address to column address delay ($T_{RCD}$), a write recovery time ($T_{WR}$), or a clock period ($T_{CK}$). For example, each memory die may be tested using one or more supply voltages to verify whether each memory die satisfies one or more performance thresholds (e.g., a corresponding performance threshold for each tested performance characteristic) when supplied with a given voltage. In some cases, the given voltage may be a VDD or a VPP. At 410, it may be determined whether a memory die satisfies one or more performance thresholds when supplied with a reduced voltage (e.g., a voltage that is lower than a default (e.g., standardized or otherwise defined) supply voltage for the memory die). If the memory die satisfies the one or more performance thresholds when supplied with the reduced voltage, the process may proceed to 415. Or, if the memory die fails to satisfy a performance threshold when supplied with the reduced voltage, the process may proceed to 435.

At 415, based on determining that the memory die satisfies the one or more performance thresholds performance threshold when supplied with the reduced voltage, the memory die may be classified as a low-voltage memory die. At 420, a memory device may be assembled that includes one or more low-voltage memory dies and the PMIC. At 425, an output voltage (e.g., a VDD, or a VPP, or both) of the PMIC may be set to the reduced voltage. At 430, the memory device may be operated using reduced voltage. For example, the memory device may be incorporated into a system wherein the memory device is in communication with a host device and may execute one or more access operations while receiving one or more supply voltages that are less than a default voltage range associated with the supply voltage.

At 435, it may be determined whether a memory die satisfies the one or more performance thresholds while receiving a supply voltage that is a nominal voltage (e.g., that is within a default voltage range for the memory die, such as a default value plus or minus some tolerance). If it is determined that the memory die satisfies the one or more performance thresholds while receiving the supply voltage that is the nominal voltage, the process may proceed to 440. Or, if it is determined that the memory die fails to satisfy the performance threshold when supplied with the nominal voltage, the process may proceed to 460. At 460, it may be determined whether a memory die satisfies the one or more performance thresholds while receiving a supply voltage that is elevated (e.g., that is above a default voltage range for the memory die). If it is determined that the memory die satisfies the one or more performance thresholds while receiving the supply voltage that is the elevated voltage, the process may proceed to 465. In some cases, if it is determined that the memory die fails to satisfy the performance threshold when supplied with the elevated voltage, the process may proceed to 485, and the memory die may be discarded. Though the example of FIG. 4 illustrates the determination at 435 as occurring after the determination at 410, it is to be understood that the determination at 435 may alternatively occur before the determination at 410, and that in general the aspects of process 400 may otherwise be rearranged temporally relative to the example of FIG. 4.

At 440, based on determining that the memory die satisfies the one or more performance thresholds at the nominal voltage, the memory die may be classified as a nominal-voltage memory die. Alternatively, the memory die may be classified as a nominal-voltage die based on a determination that that the memory die fails to satisfy the one or more performance thresholds at the reduced voltage (e.g., at 410), and a separate determination at 435 may not be performed.

At 445, a memory device may be assembled that includes one or more nominal-voltage memory dies and a PMIC. At 450, an output voltage of the PMIC (e.g., included on the nominal-voltage memory dies) may be set to the nominal voltage. For example, one or more supply voltages provided by the PMIC (e.g., a VDD, a VPP) may be set to the nominal voltage. At 455, the memory device may be operated using nominal voltage. For example, the memory device may be incorporated into a system wherein the memory device is in communication with a host device and may execute one or more access operations while receiving supply voltages that are within the defined voltage ranges.

In some cases, at 465, the memory die may be classified as an elevated-voltage memory die. For example, the memory die may be classified as an elevated-voltage memory die based on failing the evaluation at 435. Additionally or alternatively, the memory die may be classified as an elevated-voltage memory die based on satisfying the one or more performance thresholds using an elevated voltage (e.g., a voltage that is above a defined voltage range for the memory die). At 470, a memory device may be assembled that includes one or more elevated-voltage memory dies and a PMIC. At 475 an output voltage of the PMIC (e.g., included on an elevated-voltage memory die) may be set to the elevated voltage. For example, a VDD, or a VPP, or both, provided by the PMIC may be set to the elevated voltage., At 480, the memory device may be operated using elevated voltage. For example, the memory device may be incorporated into a system wherein the memory device is in communication with a host device and may execute one or more access operations while receiving one or more supply voltages that are greater than a defined voltage range associated with the supply voltage.

In the example of process flow 400, the one or more performance characteristics of the memory dies may be tested prior to an assembly of the memory device. Additionally or alternatively, however, one or more performance characteristics of the memory dies may be tested after the memory device is assembled. Here, the voltage levels of each of the supply voltages output by a PMIC may be configured based on the testing of the memory dies included in a same memory device as the PMIC after the assembly of the memory device.

For example, a memory device may be assembled to include a set of memory dies and a PMIC, where the memory dies may or may not have previously been tested individually. Testing may then be performed to determine whether each of the memory dies included in the memory device satisfies one or more performance thresholds while receiving one or more supply voltages that are less than a defined voltage range (e.g., while receiving one or more reduced voltages). If each memory die satisfies the one or more performance thresholds, the PMIC may be configured to provide the one or more reduced voltages to the memory device. Or, if one or more of the memory dies fail to satisfy a performance threshold while receiving one or more reduced voltages, the PMIC may be configured to provide nominal supply voltages to the memory device. In some cases, the test equipment may test each of the memory dies of a memory device (e.g., after assembly) at the nominal voltage. If one or more memory dies fail to satisfy the one or more performance thresholds at the nominal voltage, or to improve the performance of the memory dies, the PMIC may be configured to provide one or more supply voltages that are elevated (e.g., greater than a defined voltage range).

Figure 5:
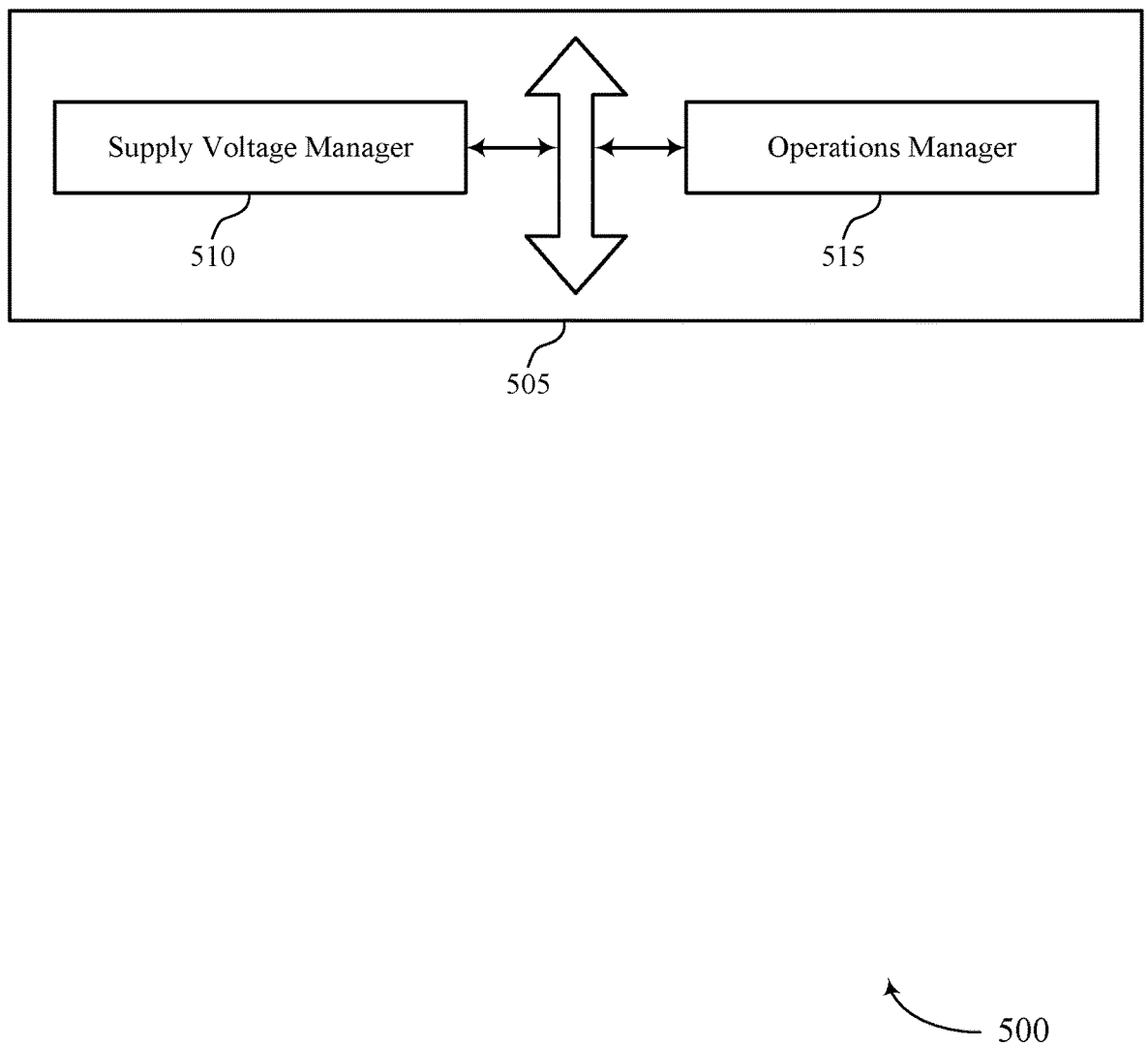
FIG. 5 shows a block diagram of a system that supports power management for a memory device in accordance with aspects of the present disclosure.

FIG. 5 shows a block diagram 500 of a system 505 that supports power management for a memory device in accordance with examples as disclosed herein. The system 505 may be an example of aspects of a system as described with reference to FIGS. 1 through 3. The system 505 may include a supply voltage manager 510 and an operations manager 515. Each of these modules may communicate, directly or indirectly, with one another (e.g., via one or more buses). In some cases, the supply voltage manager 510 may be or be included in a PMIC as described herein, and the operations manager 515 may be included in a memory die as described herein. In some cases, a system may include multiple memory dies, which may each include a respective operations manager 515.

The supply voltage manager 510 may generate, using a PMIC that is coupled with a memory die, a first voltage that is within a first defined voltage range corresponding to a first supply voltage for the memory die. In some examples, the supply voltage manager 510 may generate, using the PMIC, a second voltage that is outside a second defined voltage range corresponding to a second supply voltage for the memory die. In some cases, the supply voltage manager 510 is configured to provide the second voltage based on the memory die satisfying a performance threshold when using the second voltage as the second supply voltage.

In some instances, the supply voltage manager 510 may identify the second voltage during an initialization procedure executed prior to operating the memory die. In some cases, the second voltage is below the second defined voltage range. In some cases, the second voltage is above the second defined voltage range.

The operations manager 515 may operate the memory die using the first voltage as the first supply voltage and the second voltage as the second supply voltage. In some cases, the memory die is configured to exchange signaling with a host device in accordance with a memory standard. In some instances, the first defined voltage range and the second defined voltage range being defined comprises the first defined voltage range and the second defined voltage range being specified by the memory standard. In some examples, the operations manager 515 may operate one or more additional memory dies coupled with the PMIC using the first voltage and the second voltage as one or more respective first supply voltages and one or more second supply voltages for the one or more additional memory dies.

Figure 6:
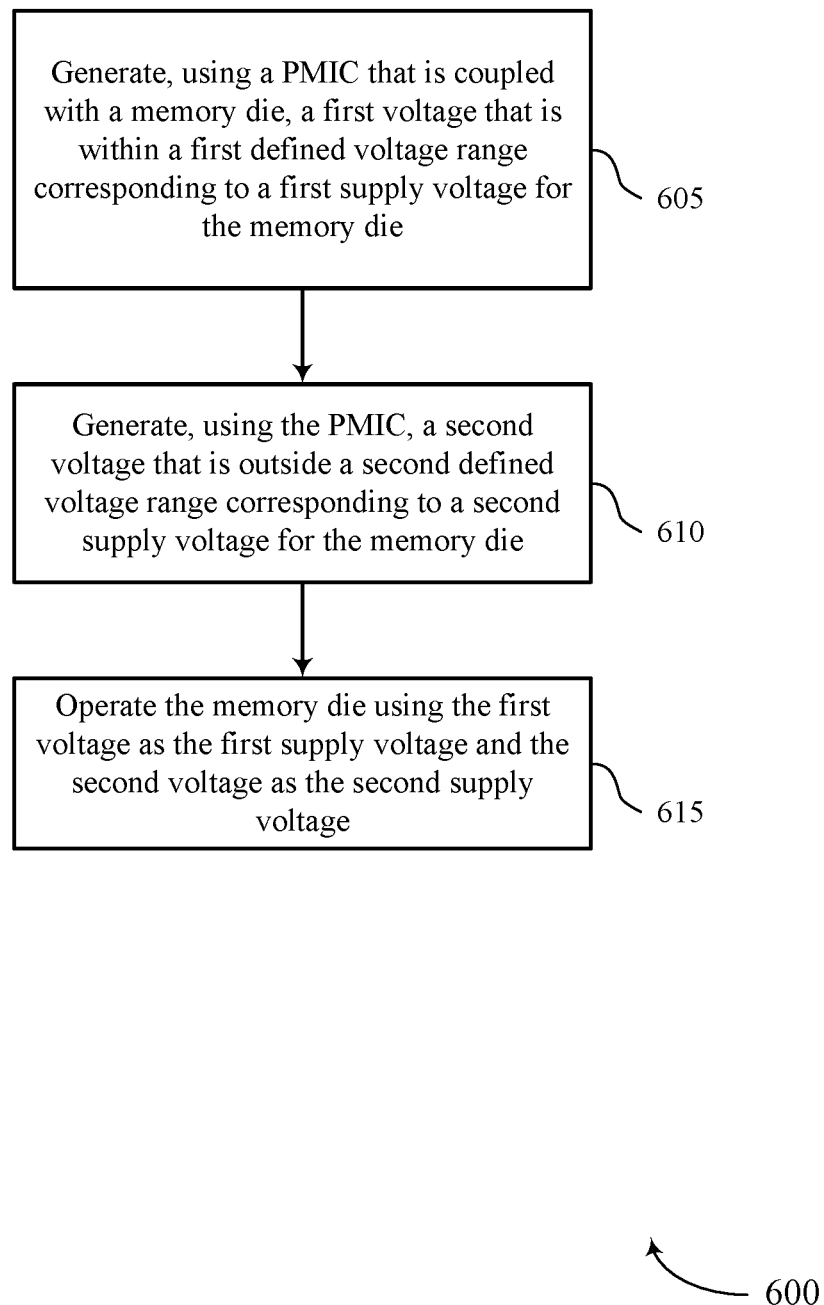
FIGS. 6 and 7 show flowcharts illustrating a method or methods that support power management for a memory device in accordance with examples as disclosed herein.

FIG. 6 shows a flowchart illustrating a method or methods 600 that supports power management for a memory device in accordance with aspects of the present disclosure. The operations of method 600 may be implemented by a system or its components as described herein. For example, the operations of method 600 may be performed by a system as described with reference to FIG. 5. In some examples, a system may execute a set of instructions to control the functional elements of the system to perform the described functions. Additionally or alternatively, a system may perform aspects of the described functions using special-purpose hardware.

At 605, the system may generate, using a PMIC that is coupled with a memory die, a first voltage that is within a first defined voltage range corresponding to a first supply voltage for the memory die. The operations of 605 may be performed according to the methods described herein. In some examples, aspects of the operations of 605 may be performed by a supply voltage manager as described with reference to FIG. 5.

At 610, the system may generate, using the PMIC, a second voltage that is outside a second defined voltage range corresponding to a second supply voltage for the memory die. The operations of 610 may be performed according to the methods described herein. In some examples, aspects of the operations of 610 may be performed by a supply voltage manager as described with reference to FIG. 5.

At 615, the system may operate the memory die using the first voltage as the first supply voltage and the second voltage as the second supply voltage. The operations of 615 may be performed according to the methods described herein. In some examples, aspects of the operations of 615 may be performed by an operations manager as described with reference to FIG. 5.

In some examples, an apparatus as described herein may perform a method or methods, such as the method 600. The apparatus may include features, means, or instructions (e.g., a non-transitory computer-readable medium storing instructions executable by a processor) for generating, using a PMIC that is coupled with a memory die, a first voltage that is within a first defined voltage range corresponding to a first supply voltage for the memory die, generating, using the PMIC, a second voltage that is outside a second defined voltage range corresponding to a second supply voltage for the memory die, and operating the memory die using the first voltage as the first supply voltage and the second voltage as the second supply voltage.

Some examples of the method 600 and the apparatus described herein may further include operations, features, means, or instructions for operating one or more additional memory dies coupled with the PMIC using the first voltage and the second voltage as one or more respective first supply voltages and one or more second supply voltages for the one or more additional memory dies.

In some cases of the method 600 and the apparatus described herein, generating the second voltage further may include operations, features, means, or instructions for identifying the second voltage during an initialization procedure executed prior to operating the memory die.

In some instances of the method 600 and the apparatus described herein, the second voltage may be below the second defined voltage range.

In some examples of the method 600 and the apparatus described herein, the second voltage may be above the second defined voltage range.

Figure 7:
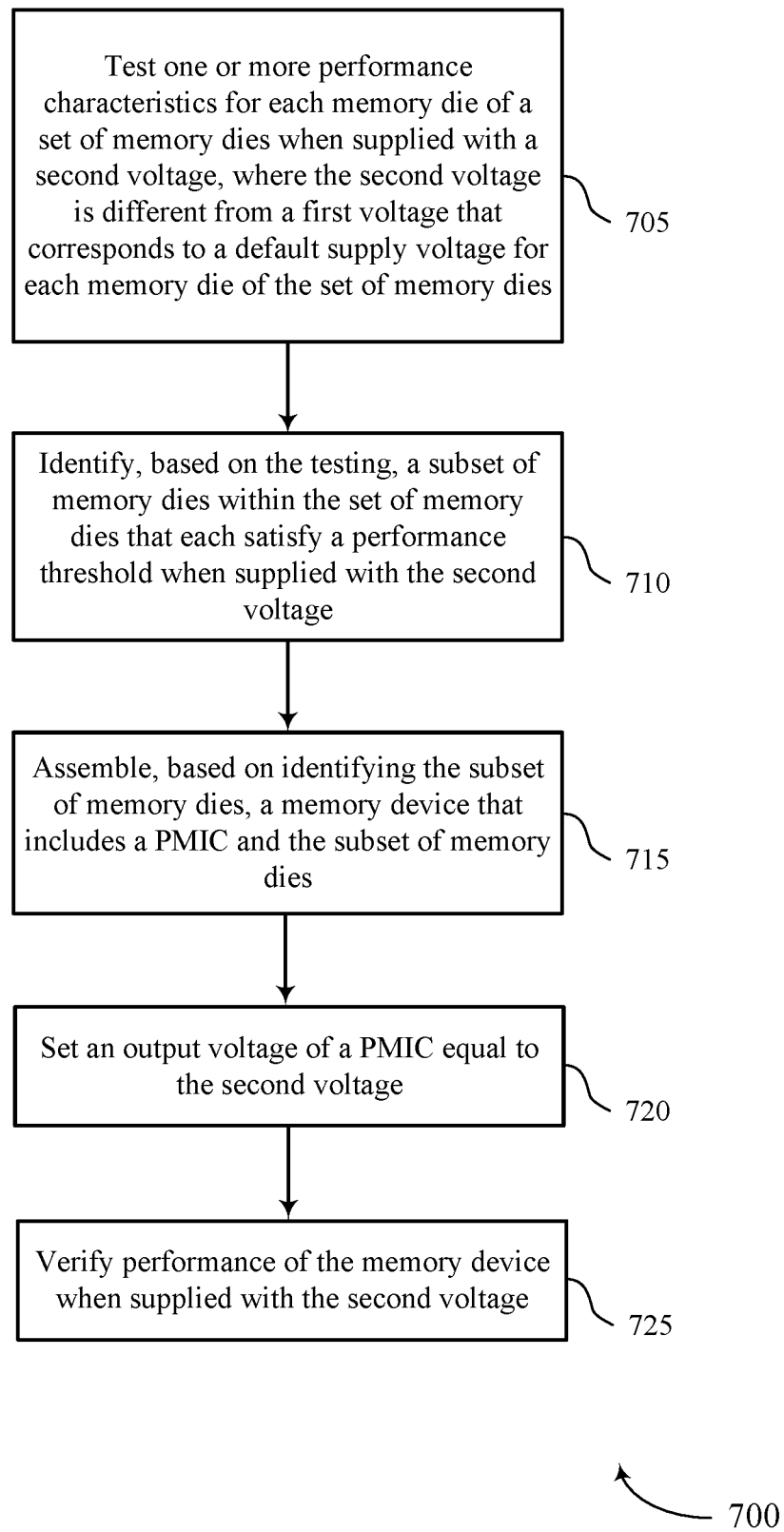

FIG. 7 shows a flowchart illustrating a method or methods 700 that supports power management for a memory device in accordance with aspects of the present disclosure. The operations of method 700 may be implemented as described herein by test equipment, fabrication equipment, or any combination thereof.

At 705, test equipment, fabrication equipment, or any combination thereof may test one or more performance characteristics for each memory die of a set of memory dies when supplied with a second voltage, where the second voltage is different from a first voltage that corresponds to a default supply voltage for each memory die of the set of memory dies. The operations of 705 may be performed according to the methods described herein.

At 710, test equipment, fabrication equipment, or any combination thereof may identify, based on the testing, a subset of memory dies within the set of memory dies that each satisfy a performance threshold when supplied with the second voltage. The operations of 710 may be performed according to the methods described herein.

At 715, test equipment, fabrication equipment, or any combination thereof may assemble, based on identifying the subset of memory dies, a memory device that includes a PMIC and the subset of memory dies. The operations of 715 may be performed according to the methods described herein.

At 720, test equipment, fabrication equipment, or any combination thereof may set an output voltage of the PMIC equal to the second voltage, where the PMIC is configured to supply the second voltage to the subset of memory dies during operation of the memory device based on the output voltage of the PMIC being set to the second voltage. The operations of 720 may be performed according to the methods described herein.

At 725, test equipment, fabrication equipment, or any combination thereof may verify a performance of the memory device when supplied with the second voltage. In one example, the test equipment or fabrication equipment may determine that the memory device satisfies one or more performance thresholds when supplied with the second voltage based on verifying the performance of the memory device. Here, the memory device may subsequently operate while being supplied with the second voltage. In another example, the test equipment or fabrication equipment may determine that the memory device fails to satisfy one or more performance thresholds when supplied with the second voltage. Here, the test equipment or fabrication equipment may reconfigure the output voltage of the PMIC (e.g., to the first voltage, which may enable the memory device to satisfy the one or more performance thresholds).

In some examples, an apparatus as described herein may perform a method or methods, such as the method 700. The apparatus may include features, means, or instructions (e.g., a non-transitory computer-readable medium storing instructions executable by a processor) for testing one or more performance characteristics for each memory die of a set of memory dies when supplied with a second voltage, where the second voltage is different from a first voltage that corresponds to a default supply voltage for each memory die of the set of memory dies, identifying, based on the testing, a subset of memory dies within the set of memory dies that each satisfy a performance threshold when supplied with the second voltage, assembling, based on identifying the subset of memory dies, a memory device that includes a PMIC and the subset of memory dies, and setting an output voltage of the PMIC equal to the second voltage, where the PMIC is configured to supply the second voltage to the subset of memory dies during operation of the memory device based on the output voltage of the PMIC being set to the second voltage.

In some examples of the method 700 and the apparatus described herein, the output voltage of the PMIC may be configurable prior to setting the output voltage of the PMIC equal to the second voltage, and the output voltage of the PMIC may be fixed at the second voltage after assembling the memory device.

Some cases of the method 700 and the apparatus described herein may further include operations, features, means, or instructions for identifying, based on the testing, a second subset of memory dies within the set of memory dies that each fail the performance threshold when supplied with the second voltage, assembling, based on identifying the second subset of memory dies, a second memory device that includes a second PMIC and the second subset of memory dies, and setting an output voltage of the second PMIC equal to the first voltage, where the second PMIC may be configured to supply the first voltage to the second subset of memory dies during operation of the second memory device based on the output voltage of the second PMIC being set to the first voltage.

In some instances of the method 700 and the apparatus described herein, the second voltage may be lower than the than the first voltage.

In some examples of the method 700 and the apparatus described herein, the set of memory dies may be a set of DRAM dies, and the memory device may be a DIMM.

Some cases of the method 700 and the apparatus described herein may further include operations, features, means, or instructions for testing the subset of memory dies after the assembling, where setting the output voltage of the PMIC equal to the second voltage equal to the second voltage occurs after the assembling and may be based on the testing of the subset of memory dies. Testing the subset of memory dies after the assembling as described herein may occur after or alternatively in lieu of testing individual memory dies prior to assembling.

It should be noted that the methods described herein describe possible implementations, and that the operations and the steps may be rearranged or otherwise modified and that other implementations are possible. Further, portions from two or more of the methods may be combined.

An apparatus is described. The apparatus may include a memory die configured to operate using a first supply voltage and a second supply voltage, where the first supply voltage is associated with a first defined voltage range and the second supply voltage is associated with a second defined voltage range, and may include a PMIC coupled with the memory die and configured to provide, to the memory die as the first supply voltage, a first voltage that is within the first defined voltage range and provide, to the memory die as the second supply voltage, a second voltage that is outside the second defined voltage range.

In some examples, the PMIC is configured to identify the second voltage that is outside the second defined voltage range during an initialization of the system, where providing the second voltage may be based on the identifying.

In some cases, the apparatus may include a register coupled with or included in the PMIC and configured to store a value indicating the second voltage that may be outside the second defined voltage range, where the identifying may be based on the register storing the value indicating the second voltage.

In some instances, the memory die may be configured to be coupled with a host device, and the value may be unalterable by the host device.

In some examples, the PMIC may be configured to provide the second voltage based on the memory die satisfying a performance threshold when using the second voltage as the second supply voltage.

In some cases, a DIMM includes the PMIC, the memory die, and one or more additional memory dies each configured to operate using the first supply voltage and the second supply voltage, the memory die and the one or more additional memory dies each include DRAM memory cells, and the PMIC may be further configured to provide, to each of the one or more additional memory dies as the first supply voltage, the first voltage that is within the first defined voltage range and to provide, to each of the one or more additional memory dies as the second supply voltage, the second voltage that is outside the second defined voltage range.

In some instances, the second voltage may be below the second defined voltage range. In some other instances, the second voltage may be above the second defined voltage range.

In some examples, the memory die may be configured to exchange signaling with a host device in accordance with a memory standard, and the first defined voltage range and the second defined voltage range being defined includes the first defined voltage range and the second defined voltage range being specified by the memory standard.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A system, comprising:
   a memory die configured to exchange signaling with a host device in accordance with a memory standard and to operate using a first supply voltage and a second supply voltage, wherein the first supply voltage is associated with a first defined voltage range specified by the memory standard and the second supply voltage is associated with a second defined voltage range specified by the memory standard; and
   a power management integrated circuit (PMIC) coupled with the memory die and configured to:
      read a first value stored in a register and a second value stored in the register, wherein the first value indicates a first voltage for the first supply voltage and the second value indicates a second voltage for the second supply voltage;
      provide, to the memory die as the first supply voltage and after reading the first value and the second value, the first voltage that is within the first defined voltage range specified by the memory standard based at least in part on reading the first value stored in the register; and
      provide, to the memory die as the second supply voltage, the second voltage that is outside the second defined voltage range specified by the memory standard concurrent with providing the first voltage based at least in part on reading the second value stored in the register.

2. The system of claim 1, wherein the PMIC is further configured to:
   identify the second voltage that is outside the second defined voltage range during an initialization of the system, wherein providing the second voltage is based at least in part on the identifying.

3. The system of claim 2, further comprising:
   the register coupled with or included in the PMIC and configured to store the first value indicating the first voltage that is within the first defined voltage range and the second value indicating the second voltage that is outside the second defined voltage range, wherein the identifying is based at least in part on the register storing the first value indicating the first voltage and the second value indicating the second voltage.

4. The system of claim 3, wherein:
   the memory die is configured to be coupled with the host device; and
   the first value and the second value are unalterable by the host device.

5. The system of claim 1, wherein the PMIC is configured to provide the second voltage based at least in part on the memory die satisfying a performance threshold when using the second voltage as the second supply voltage.

6. The system of claim 1, wherein:
   a dual in-line memory module (DIMM) comprises the PMIC, the memory die,
   and one or more additional memory dies each configured to operate using the first supply voltage and the second supply voltage;
   the memory die and the one or more additional memory dies each comprise dynamic random access memory (DRAM) memory cells; and
   the PMIC is further configured to:
      provide, to each of the one or more additional memory dies as the first supply voltage, the first voltage that is within the first defined voltage range; and
      provide, to each of the one or more additional memory dies as the second supply voltage, the second voltage that is outside the second defined voltage range.

7. The system of claim 1, wherein the second voltage is below the second defined voltage range.

8. The system of claim 1, wherein the second voltage is above the second defined voltage range.

9. A method, comprising:
   reading, by a power management integrated circuit (PMIC) that is coupled with a memory die configured to exchange signaling with a host device in accordance with a memory standard, a first value stored in a register and a second value stored in the register, wherein the first value indicates a first voltage for a first supply voltage and the second value indicates a second voltage for a second supply voltage;
   generating, using the PMIC and after reading the first value and the second value, the first voltage that is within a first defined voltage range specified by the memory standard corresponding to the first supply voltage for the memory die based at least in part on reading the first value stored in the register;
   generating, using the PMIC, the second voltage that is outside a second defined voltage range specified by the memory standard corresponding to the second supply voltage for the memory die based at least in part on reading the second value stored in the register; and
   operating the memory die using, concurrently, the first voltage as the first supply voltage and the second voltage as the second supply voltage.

10. The method of claim 9, further comprising:
    operating one or more additional memory dies coupled with the PMIC using the first voltage and the second voltage as one or more respective first supply voltages and one or more second supply voltages for the one or more additional memory dies.

11. The method of claim 9, wherein generating the second voltage further comprises:
    identifying the second voltage during an initialization procedure executed prior to operating the memory die.

12. The method of claim 11, further comprising:
    storing the first value indicating the first voltage that is within the first defined voltage range and the second value indicating the second voltage that is outside the second defined voltage range to the register coupled with or included in the PMIC, wherein the identifying is based at least in part on storing the first value indicating the first voltage and the second value indicating the second voltage to the register.

13. The method of claim 12, wherein:
the memory die is configured to be coupled with the host device; and
the first value and the second value are unalterable by the host device.

14. The method of claim 9, wherein the second voltage is below the second defined voltage range.

15. The method of claim 9, wherein the second voltage is above the second defined voltage range.

16. The method of claim 9, wherein generating the second voltage using the PMIC is based at least in part on the memory die satisfying a performance threshold when using the second voltage as the second supply voltage.

17. A memory device, comprising:
a memory die configured to exchange signaling with a host device in accordance with a memory standard; and
one or more controllers coupled with the memory die, wherein the one or more controllers are configured to cause the memory device to:
read, by a power management integrated circuit (PMIC) that is coupled with the memory die, a first value stored in a register and a second value stored in the register, wherein the first value indicates a first voltage for a first supply voltage and the second value indicates a second voltage for a second supply voltage;
generate, using the PMIC and after reading the first value and the second value, the first voltage that is within a first defined voltage range specified by the memory standard corresponding to the first supply voltage for the memory die based at least in part on reading the first value stored in the register;
generate, using the PMIC, the second voltage that is outside a second defined voltage range specified by the memory standard corresponding to the second supply voltage for the memory die based at least in part on reading the second value stored in the register; and
operate the memory die using, concurrently, the first voltage as the first supply voltage and the second voltage as the second supply voltage.

18. The memory device of claim 17, wherein the one or more controllers are further configured to cause the memory device to:
operate one or more additional memory dies coupled with the PMIC using the first voltage and the second voltage as one or more respective first supply voltages and one or more second supply voltages for the one or more additional memory dies.

19. The memory device of claim 17, wherein, to generate the second voltage, the one or more controllers are further configured to cause the memory device to:
identify the second voltage during an initialization procedure executed prior to operating the memory die.

* * * * *